United States Patent [19]

Walter et al.

[11] Patent Number: 4,586,778

[45] Date of Patent: May 6, 1986

[54] COMPLIANT PIN

[75] Inventors: Leo Walter, Palos Verdes Peninsula, Calif.; Charles E. Ring, Minneapolis, Minn.; Bryan R. Seppala, Cottage Grove, Minn.; Patric M. Kennelly, White Bear Lake, Minn.; James P. Marnie, Lake Elmo, Minn.

[73] Assignee: BMC Industries, Inc., St. Paul, Minn.

[21] Appl. No.: 763,752

[22] Filed: Aug. 1, 1985

Related U.S. Application Data

[63] Continuation of Ser. No. 526,262, Aug. 25, 1983, abandoned, which is a continuation-in-part of Ser. No. 480,918, Apr. 7, 1983, abandoned.

[51] Int. Cl.[4] .......................... H01R 4/28; H05K 1/04

[52] U.S. Cl. .............................. 339/221 R; 339/17 C

[58] Field of Search ............. 339/17 C, 220 R, 221 R, 339/221 M, 252 R, 276 A

[56] References Cited

U.S. PATENT DOCUMENTS

| | | | |
|---|---|---|---|
| 3,824,554 | 7/1974 | Shoholm | 339/221 R |
| 3,827,004 | 7/1974 | Vanden Heuvel et al. | 339/221 R |
| 3,907,400 | 9/1975 | Dennis | 339/221 R |
| 3,975,078 | 8/1976 | Ammon | 339/221 M |
| 4,017,143 | 4/1977 | Knowles | 339/221 R |
| 4,186,982 | 2/1980 | Cobaugh et al. | 339/17 C |
| 4,223,970 | 9/1980 | Walter | 339/17 C |
| 4,274,699 | 6/1981 | Keim | 339/220 R X |
| 4,415,220 | 11/1983 | Kant | 339/221 R |
| 4,464,009 | 8/1984 | Thaler | 339/17 C X |
| 4,475,780 | 10/1984 | Walter et al. | 339/17 C |

*Primary Examiner*—Gil Weidenfeld

*Assistant Examiner*—Steven C. Bishop

*Attorney, Agent, or Firm*—Jacobson and Johnson

[57] ABSTRACT

A compliant electrical connector pin has opposed convex surfaces to grip the surfaces of a hole in a circuit board, the pin having a compliant region so that the pin compresses to reduce the cross sectional area of the pin as the pin is inserted into the hole with the pin having a transition zone proximate the compliant region with the transition zone and the compliant region sufficiently interrelated so that the transition zone partially expands the hole in the circuit board before the hole in the circuit board begins to compress the compliant region of the pin with the compliant region and the hole coacting to provide a low resistance electrical connection between mating surfaces of the hole and the pin without rupturing the material on the side walls of the hole with the compliant pin structure being able to withstand vibration without fracturing.

10 Claims, 11 Drawing Figures

COMPLIANT PIN

RELATED APPLICATION

This is a continuation of U.S. patent application Ser. No. 526,262, filed 8,25,82 now abandoned, which is a continuation-in-part application of U.S. patent application Ser. No. 480,918 titled COMPLIANT PIN filed Apr. 7, 1983, now abandoned.

FIELD OF THE INVENTION

This invention relates generally to the joining of electrical connectors to circuit baords and, more particularly, to the construction of the transition zone adjacent the compliant region to provide a low resistance electrical connection between a compliant pin and the side walls of a hole in a circuit board without rupturing the side walls of the hole or overstressing the pin.

BACKGROUND OF THE INVENTION

In order to provide a compliant pin for multiple use it is desirable to have a compliant pin that does not damage the side walls of the circuit board hole during insertion of the pin into the hole. That is, insertion of the compliant pin should not physically damage the side walls of the hole since a rupture of the side walls of the hole may lead to eventual failure of the low resistance connection between the pin and the side walls of the hole. Yet the compliant pin should be held sufficiently tight so as not to be easily withdrawn. In addition, the compliant pin should be able to withstand vibration forces without breakages. Unfortunately, it has been found that some prior art compliant pins that can withstand vibration forces damage the hole during insertion of the pin in the circuit board. Still other prior art compliant pins that do not damage the hole during insertion of the pin into the circuit board are not capable of withstanding vibration forces.

We have discovered a compliant pin structure which can withstand vibration forces yet does not damage the hole side walls during insertion of the pin into the circuit board.

SUMMARY OF THE INVENTION

Briefly, the invention comprises a compliant pin having a transition zone and a compliant region with the transition zone characterized by a compliant region extending into the transition zone so that upon insertion of the compliant pin into an opening in a circuit board the opening in the circuit board is required to partially expand before the compliant region begins to compress from contact with the side walls of the opening in the circuit board.

DRAWING DESCRIPTION

DETAILED DESCRIPTION

Figure 1:
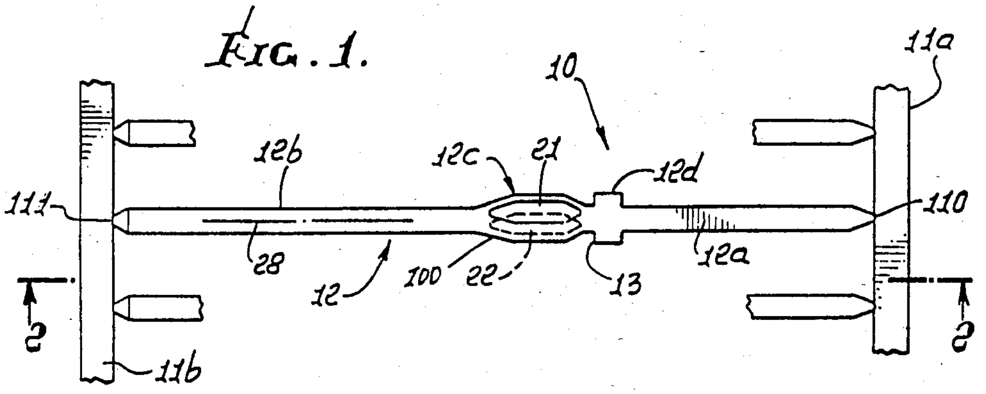
FIG. 1 is a plan view of a connector embodying the invention.
Figure 2:
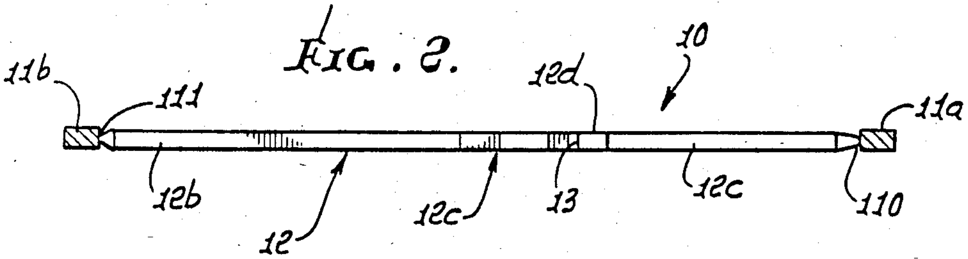
FIG. 2 is a side elevation taken on lines 2—2 of FIG. 1.

In FIGS. 1 and 2 a contact or connector pin 10 is shown to comprise an axially elongated flat member 12. Member 12 includes a first section 12*a*, a wire wrap post section 12*b*, an intermediate compliant section 12*c*, a step shoulder section 12*d* which joins sections 12*a* and 12*b*. Sections 12*a* and 12*b* are shown in FIG. 1 to have the same width, which is less than the width of compliant section 12*c*. Located in compliant section 12*c* is a transition zone 100 which physically engages the hole side walls in a circuit board prior to the hole side walls engaging the compliant region in compliant section 12*c*. FIG. 1 shows that during stamping formation of pin 10 the opposite ends of pin 10 may be joined to elongated holding strips 11*a* and 11*b* by narrowed break-off connections 110 and 111.

Figure 3:
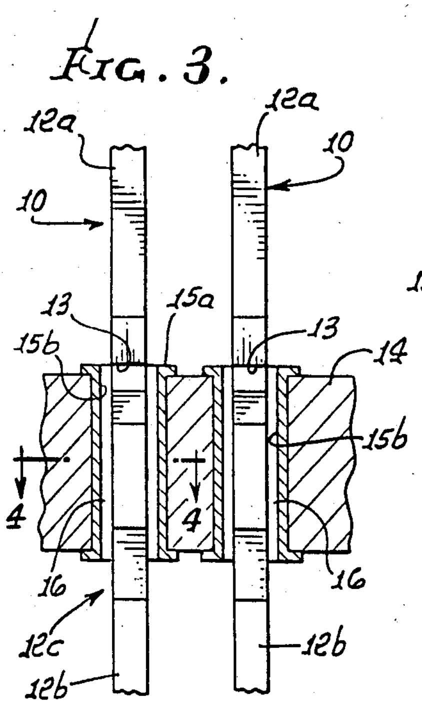
FIG. 3 is a vertical section showing a typical application of the FIG. 1 connection.

Located in pin 10 is a step shoulder 13 which is formed at the junction of sections 12*c* and 12*d*. Step shoulder 13 is adapted to engage the printed circuit backplane board 14 or ring 15*a* (FIG. 3) to thereby limit the insertion of pin 10 into the board. FIG. 3 shows two connectors 10 inserted through openings or holes 16 which comprise a circular electrically conductive cylinder 15*b*.

Figure 4:
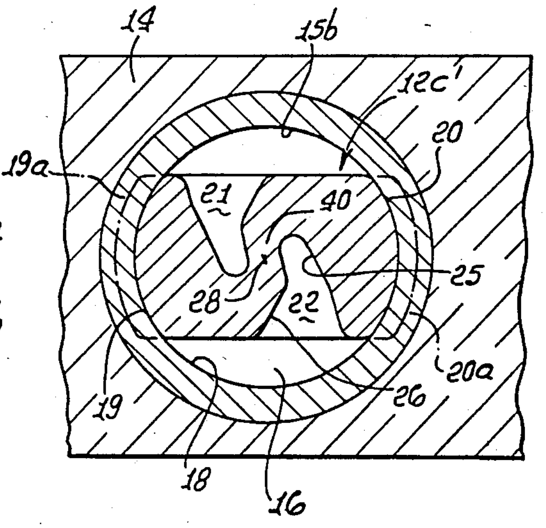
FIG. 4 is an enlarged section taken on lines 4—4 of FIG. 3.
Figure 5:
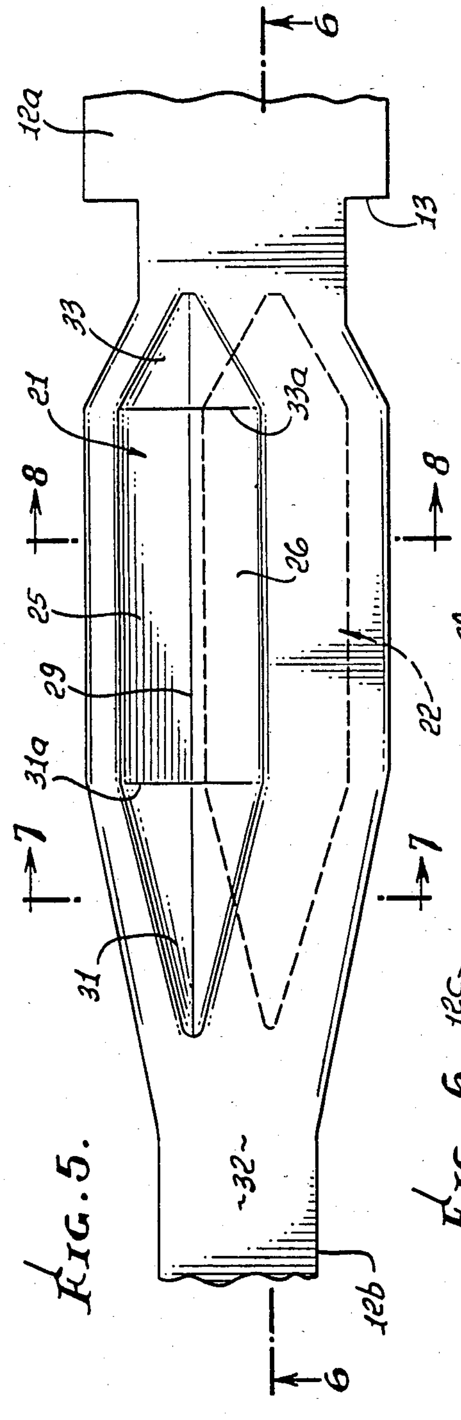
FIG. 5 is an enlarged fragmentary side view of the grooved portion of the FIG. 1 connector pin.
Figure 8:
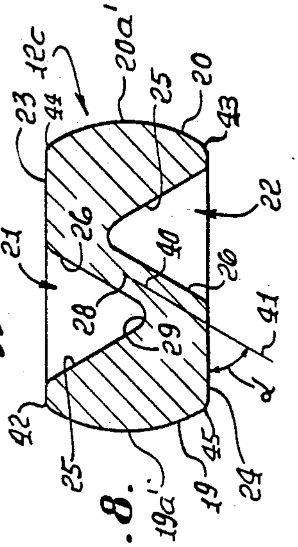
FIG. 8 is a sectional view taken on lines 8—8 of FIG. 5.

FIG. 4 and FIG. 8 show compliant pin section 12*c* has opposite outer surfaces 19 and 20 forcibly gripping the inside surfaces of conductive cylinder 15*b* as pin 10 is inserted into hole 16 in cylinder 15*b*. In the example shown in FIGS. 4–8 compliant section 12*c* has convex opposite outer surfaces 19 and 20 with a radius of curvature generally the same as the radius of curvature of circular hole 10. Outer surfaces 19 and 20 forcibly and frictionally grip the inside of cylinder 15*b* upon insertion of compliant section 12*c* into cylinder 15*b* as compliant section 12*c* compresses inward so that the outer surfaces 19 and 20 on the compliant pin section 12*c* move from the broken line positions 19*a* and 20*a* to the positions indicated in FIG. 4. In the embodiment shown in FIG. 4 the mating surfaces of both pin 12 and cylinder 15*b* distribute their grip loading over a relatively large contact area, to thereby provide good electrical contact without scoring or damaging the interior side wall surfaces of cylinder 15*b*.

In the embodiment shown in FIGS. 5–8 pin 10 includes a compliant region 12*c* having at least one elongated groove 21 located in the side thereof, groove 21 extends axially of pin 10 and is configured to locally weaken pin 10 so that at least one flexure 40 is formed by pin 10 to extend and along the length of groove 12. Flexure 40 (FIG. 8) is adapted to resiliently flex in response to insertion of compliant pin 10 into the circuit board 14. Located on the surface opposite groove 21 is a second groove 22. Grooves 21 and 22 which are located in opposite sides 23 and 24 of compliant section 12*c* give the pin cross section a generally Z-shape (FIG. 8). Each groove has opposite side walls 25 and 26 forming a generally V-shaped groove cross section along the major length of each groove and in planes normal to the axis of pin 10. FIG. 8 shows the bottom 29 of grooves 21 and 22 are generally concavely radiused. Generally, the depth of each groove is such as to accommodate relative movement of walls 25 and 26 toward one another in response to insertion of pin 10 into a circuit board. In the embodiment shown in FIG. 4 the full depth of each groove is greater than one-half the thickness of the section 12c between sides 23 and 24 but less than three-quarters of the thickness of section 12c.

FIG. 8 shows flexure 40 formed between grooves 21 and 22 to define a plane 41 that extends at an angle $\alpha$ relative to flat sides 23 and 24. In general, the angle $\alpha$ is between 45° and 75° in the unflexed condition. In the flexed condition (FIG. 4) flexure 40 has an S-shape, wall 25 is concave, wall 26 is concave; whereas in the unflexed condition (FIG. 8) walls 25 and 26 are generally flat. The center of flexure 40, designated by reference numeral 28, lies approximately midway between crests 12a' and 20a' of surfaces 19 and 20.

Figure 6:
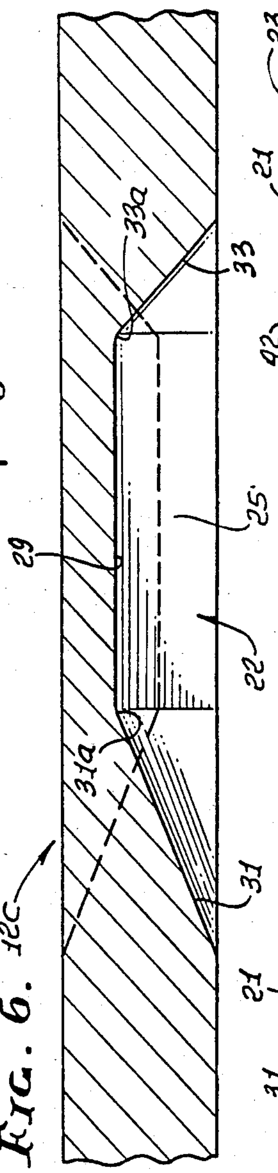
FIG. 6 is a sectional view taken on lines 6—6 of FIG. 5.
Figure 7:
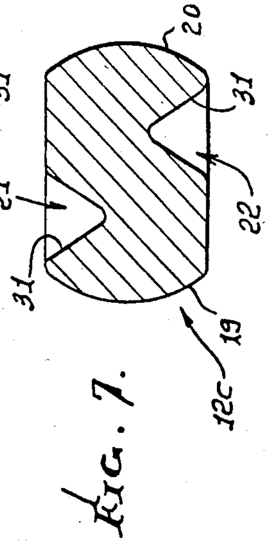
FIG. 7 is a sectional view taken on lines 7—7 of FIG. 5.

FIGS. 6–8 show that the depth of grooves 21 and 22 progressively increases along the apex 31. Likewise at the opposite end of grooves 21 and 22 the depth of grooves 21 and 22 progressively increases along the apex 33 until it is at the full groove depth indicated by apex 29. In the embodiment shown the shape of both grooves 21 and 22 are similar or identical. Apex 31 and 33 concavely merge at junctions 31a and 33a with groove walls 25 and 26.

The outer radiused surface of compliant section 12b prevents gouging of surface of a hole and also distributes the compression loading over the entire surface of the pin and the opening. Note, the leading ends of groove 22 have a progressively increased depth to allow deflection to occur progressively. In this regard too large an angle between groove walls 25 and 26 would overstress the material during manufacture and could cause fracture of the metal while two small an angle would fail to develop forces that act throughout the length of the pin. Note also the concavely rounded edges 42, 43, 44 and 45 between outer surfaces 19 and 20 and sides 23 and 24.

Figure 9:
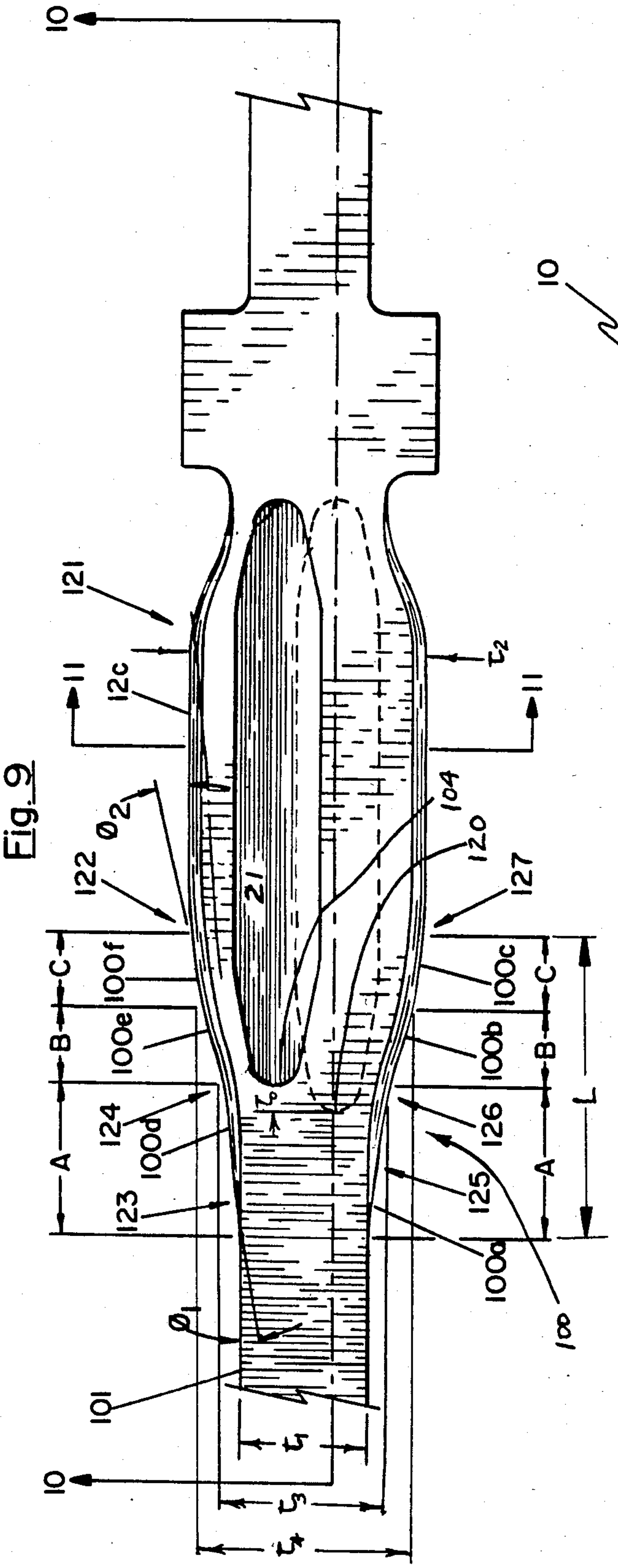
FIG. 9 is a detailed view of the transition zone.

Referring to FIG. 9 reference numeral 10 identifies an enlarged view of a preferred embodiment of a compliant pin 10. Compliant pin 10 can be inserted into a circuit board without damaging the circuit board receptacle, yet permits the pin to withstand vibration forces. Compliant pin 10 includes a front straight section 101 of thickness $t_1$ and a compliant section 12c of thickness $t_2$. Located on one side of pin 10 is elongated groove 21 which terminates at a radiused apex 104. Similarly, located on the opposite side of pin 10 there is a second elongated groove 22 that terminates at a radiused apex 120 with radiused apex 120 terminating a distance $t_0$ ahead of radiused apex 104. The off-setting of the apex of grooves 21 and 22 is believed to distribute the stress from the stamping over a large area so as to reduce the likelihood that pin 10 will break during usage. Similarly, the apex 104 and 120 are also radiused to distribute the stress from stamping the pin over a larger area and thus is believed to also contribute to reducing the likelihood that the pin will not break during usage. Typically, it has been found that if $t_0$ is 0.002" or more it is sufficient to enhance the ability of the pin to withstand a high vibration environment; however, a minimum dimensional offset of 0.005" to 0.007" is preferred.

Pin 10 is also preferably provided with radiused surfaces at the juncture of the outer plane surfaces on pin 10. That is, the radiused surface juncture of the compliant region are indicated by reference numerals 122, 123, 124, 125, 126 and 127. It is believed that in regions in which pin 10 goes from one dimension to another the juncture of the surfaces should be smooth and radiused rather than abrupt since abrupt surfaces may provide a starting place for pin breakage when the pin is subjected to vibration.

Figure 10:
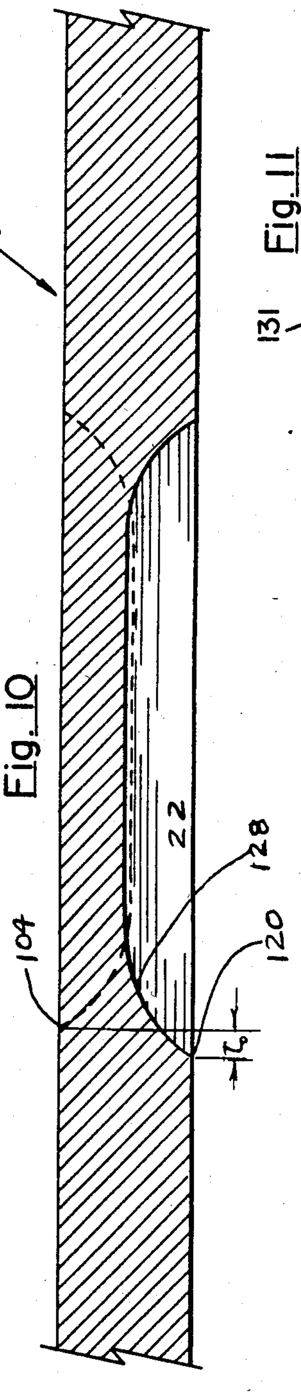
FIG. 10 is a sectional view taken along line 10—10 of FIG. 9.

In addition, it is also believed that to further enhance the resisting of the pin to fracture the bottom of groove 22 should be provided with a radiused section 128 that blends the front portion of groove 22 with the bottom portion of groove 22 (FIG. 10). Similarly, the front portion of groove 21 is radiused to the bottom of groove 21.

It should be appreciated that to make a usable pin may not require the radiusing of the juncture of all the pin surfaces described herein; however, it is believed that the more regular and smooth the surfaces and the more widely disbursed the stress points, the more likely the pin is able to be subjected to vibration forces without fracture.

Figure 11:
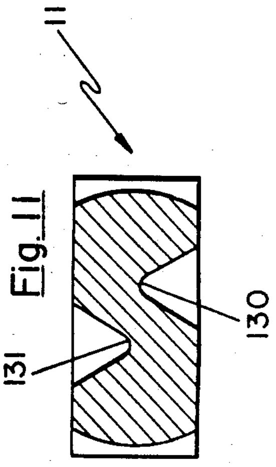
FIG. 11 is a sectional view taken along line 11—11 of FIG. 9.

FIG. 11 shows a sectional view of pin 10 with radiused surfaces 130 and 131 located in the converging portion of the apex of grooves 21 and 22.

Elongated grooves 21 and 22 as previously described provide a compliant region 12c on pin 12 which can be compressed by insertion of pin 10 into a circuit board. Transition region 100 which is located on the top and bottom of pin 10 has a length L and forms a first upper and lower transition angle $\theta_1$, with respect to the upper and lower outer flat surface of front section 101 and a second upper and lower transition angle $\theta_2$ with respect to the upper and lower outer flat surface of front section 101. Transition region 100 contains three distinct zones. A guide zone A which has a maximum dimension $t_3$. In guide zone A either the upper outer surfaces 100a or 100d guide pin 10 into alignment with a hole in a circuit board. Thus, in guide zone A it is either one of the other of outer surfaces 100a or 100d that come into contact with the hole as the pin is inserted into the board since the maximum dimension $t_3$ of guide zone A is less than the minimum dimension of the hole in the circuit board. In interface zone B there is an outer surface 100b and 100e which ranges from a minimum dimension $t_3$ to a maximum dimension $t_4$. Interface zone B produces a mechanical interface region between the side walls of the hole and the outer surfaces of pin 10 since opposite surfaces 100b and 100e simultaneously engage the hole in the circuit board. While simultaneous contact of pin 10 begins on a definite area the mechanical interface region is defined as a zone on pin 10 to indicate that the point of simultaneous contact of opposite surfaces 100e and 100b with the hole in the board may occur somewhere in zone B depending on the hole size. For example, with a hole of specified minimum dimension the side walls of the hole would engage outer surface 100e and 100b at the dimension $t_3$ while a hole of specified maximum dimension the hole would engage outer surface 100e and 100b at dimension $t_4$. The length of interface zone B is primarily determined by the specified tolerance of the holes in the board since in practice the dimensions of the pins are kept within tolerance that are usually an order of magnitude less than the tolerances of the holes in the circuit boards.

In deforming zone C the outer surface 100c and 100f are in intimate physical contact with the hole in the circuit board. Typically, the hole size in a circuit board may be 0.005" to 0.010" smaller than the compliant pin dimension $t_2$. In addition, the receptacle forming the hole in the circuit board is generally less deformable than the pin although a certain limited amount of deformation occurs. In deforming zone C the upper and lower outer surfaces 100*c* and 100*f* engage the side walls of the hole and are forced inward as the compliant pin 10 is forced into the hole in the circuit board. It will be noted that the compliant region formed by grooves 21 and 22 extends through deforming zone C and substantially through interface zone B. While it is not fully understood, it has been discovered that one factor affecting the ability of the pin to prevent hole damage is having the beginning of the compliant region extending through deforming zone C and substantially through the interface zone B while maintaining the transition angles $\theta$ approximately 15° or less. It has also been found that the incident of pin failure due to vibration forces has been virtually eliminated even if the transition zone of the pin is deformed during the insertion process. While the mechanism is not fully understood, it was noted that the transition zones with larger transition angles often had minute fractures after the pin had been inserted into the circuit board. That is, when the angle $\theta$ was sufficiently large the process of insertion of the pin into the hole in the board probably produced minute metal fractures or weak spots that made the pins more susceptible to breakage during vibration testing. In the present embodiment it is believed the increasing of the taper or holding the transition angles $\theta$ at approximately 15° or less together with extending the beginning of the compliant region into the interface zone permits the hole in the board to partially expand before the compliant region begins to compress. This coaction of hole expansion followed by compliant region compression has apparently eliminated the minute fracture in the pin which leads to pin failure during vibration testing. In general, by vibration testing it is meant that the pins must withstand 30 gs at a frequency of 10–2000 hertz for at least three 20 minute periods in each of the coordinate axes. In addition, the pin should be able to withstand 30 minutes of random vibration in each axis with the vibrations having rms value of approximately 16 gs.

Thus, the invention is characterized by having a compliant region which intercepts the hole in the board at sufficiently small angle so that insertion of the pin into the circuit board does not produce fractures in the metal pin. While the angle may vary with different materials and different hole sizes the following is a typical example of a pin size, hole size and taper which do not produce metal fracture upon insertion of the pin into the hole of the circuit board:

EXAMPLE I

The pin was comprised of a metal alloy of phosphor bronze and was designed to fit in a hole in a board having a hole dimension of 0.037" to 0.043", the $t_2$ compliant section of the pin was 0.0485" and the front section dimension $t_1$ of pin was 0.025". The angle of taper $\theta$ was approximately 15°. The board was made of standard circuit board material which is commercially available under the designation G-10. The thickness of the board was 0.125" and the hole in the board was plated with copper to a thickness of 0.0015". Located on the copper was a 0.0003" coating of solder.

240 pins were inserted into holes in a board and subjected to the above described vibration testing. None of the pins broke during vibration and none of the holes in the circuit board showed damage due to insertion of the pin into the hole.

While the aforementioned compliant region has been illustrated as being formed by elongated recesses located on opposite sides of the surface of the compliant pin, it is envisioned other compliant regions could equally well be used with our invention.

We claim:

1. A smooth surfaced compliant pin for forming a low resistance electrical connection, said compliant pin having a first section, a transition zone and a compliant region, said transition zone including a radiused surface for forming an electrical connection to a receptable without damaging the conducting surface of the receptacle, said transition zone characterized by forming a transition angle of approximately 15° or less with said first section, said compliant region extending sufficiently far into said transition zone so that upon insertion of said compliant pin into the opening in a circuit board the transition zone first expands the opening in the circuit board without rupturing the opening and then said compliant region resiliently deforms to form resilient contact between the opening in the circuit board and said compliant region.

2. The invention of claim 1 wherein said compliant region has a compliant surface and at least a portion of said compliant surface is similar in shape to the opening in the circuit board.

3. The invention of claim 2 wherein the opening in the circuit board is of cylindrical shape and said compliant pin has a cylindrical mating surface of similar shape.

4. A smooth surfaced compliant pin having a radiused surface for forming an electrical connection to a receptacle without damaging the conducting surfaces of the receptacle comprising:

a conducting member;

said conducting member including a compliant region having a surface operable for resilient displacement so that when said surface on said compliant region is in contact with a conducting surface of a receptacle said surface on said compliant region is held in contact with the conducting surface of a receptacle to provide a low resistance electrical connection between said surface on said compliant region and the conducting surface of a receptacle;

a transition region on said conducting member, said transition region including an interface zone and a radiused deforming zone with said compliant region extending substantially into said interface zone so that insertion of said pin into a receptacle produces only expansion of the receptacle without rupture of the receptacle and then produces compression of the compliant zone without rupture of the compliant zone during the insertion of said transition into the receptacle.

5. The invention of claim 4 wherein said transition region has a surface of predetermined curvature and the receptacle in the circuit board has a surface with a curvature approximately equal to the predetermined curvature of the surface of the transition region to permit mating engagement of the transition region surface and the receptacle surface.

6. The invention of claim 5 wherein said transition region is tapered.

7. The compliant pin of claim 1 wherein elongated grooves are located on opposite sides of said compliant pin.

8. The compliant pin of claim 7 wherein the elongated grooves are located in a staggered relationship to one another.

9. The compliant pin of claim 4 wherein elongated grooves are located on opposite sides of said compliant pin.

10. The compliant pin of claim 9 wherein the elongated grooves are located in a staggered relationship to one another.

* * * * *